United States Patent [19]

Asmussen

[11] Patent Number: 4,906,900
[45] Date of Patent: Mar. 6, 1990

[54] COAXIAL CAVITY TYPE, RADIOFREQUENCY WAVE, PLASMA GENERATING APPARATUS

[75] Inventor: Jes Asmussen, Okemos, Mich.

[73] Assignee: Board of Trustees operating Michigan State University, East Lansing, Mich.

[21] Appl. No.: 331,754

[22] Filed: Apr. 30, 1989

[51] Int. Cl.[4] .......................... H01J 7/24; H05B 31/26
[52] U.S. Cl. ................................ 315/111.81; 315/39; 315/111.41; 313/362.1; 250/423 R; 118/50.1; 427/38
[58] Field of Search ....................... 315/111.81, 111.41, 315/39, 111.71; 250/423 R; 313/362.1, 231.31; 333/230; 118/50.1; 427/38

[56] References Cited

U.S. PATENT DOCUMENTS

| 3,757,518 | 9/1973 | Bahr | 315/39 |
| 3,866,414 | 2/1975 | Bahr | 313/231.3 |
| 4,058,748 | 11/1977 | Sakudo et al. | 313/156 |
| 4,316,090 | 3/1982 | Sakudo et al. | 250/423 R |
| 4,393,333 | 7/1983 | Sakudo et al. | 315/111.81 |
| 4,409,520 | 10/1983 | Koike et al. | 315/39 |
| 4,507,588 | 3/1985 | Asmussen et al. | 315/39 |
| 4,585,668 | 4/1986 | Asmussen et al. | 427/38 |
| 4,630,566 | 12/1986 | Asmussen et al. | 118/50.1 |
| 4,691,662 | 9/1987 | Roppel et al. | 118/730 X |
| 4,727,293 | 2/1988 | Asmussen et al. | 315/111.41 |
| 4,777,336 | 10/1988 | Asmussen et al. | 219/10.55 M |
| 4,778,561 | 10/1988 | Ghanbari | 250/423 R X |
| 4,792,772 | 12/1988 | Asmussen | 333/231 X |

OTHER PUBLICATIONS

Rogers et al., "Standing Waves Along a Microwave Generated Surface Wave Plasma", IEEE Trans. on Plasama Science, vol. PS-10, No. 1, Mar. 1982, pp. 11-16.
R.M. Fredericks in "An Experimental & Theoretical Study of Resonantly Sustained Plasma in Microwave Cavities", PH.D. Thesis, M.S.U. (1972), pp. 30-45.
R. E. Fritz, "An Experimental Investigation of the Characteristics RF Surface Wave Generated Plasmas", M.S. Thesis, M.S.U. (1979) particularly pp. 30-38.
Fredericks et al., "Excitation of Warm Plasma . . . Short-Gap Cavity", Proc. IEEE, vol. 59, No. 2, p. 315, Feb. 1971.
Fredericks et al., "Returning and Hysteresis Effect . . . Microwave Cavity", J. Appl. Phys., vol. 42, No. 9, p. 647, Aug. 1971.

Primary Examiner—Eugene R. Laroche
Assistant Examiner—Seung Ham
Attorney, Agent, or Firm—Ian C. McLeod

[57] ABSTRACT

A coaxial radiofrequency wave plasma generating apparatus with an elongate metallic cavity (10) having a movable elongate coupling probe (16) mounted in line with an axis (a—a) of the cavity having a central coaxial conductor (11) and having a movable plate (12) for obtaining a mode of resonance of the radiofrequency wave in the cavity surrounding a chamber (14) for confining the plasma (100) is described. An end (11b) of the conductor is adjacent to the chamber and can optionally support a set of magnets (27). The apparatus is particularly useful for retrofitting existing vacumm sources (101) having small inlet ports (105) for plasma treatment using molecular beam epitaxy (MBE).

27 Claims, 7 Drawing Sheets

COAXIAL CAVITY TYPE, RADIOFREQUENCY WAVE, PLASMA GENERATING APPARATUS

BACKGROUND OF THE INVENTION (1) Summary of the Invention

The present invention relates to an improved coaxial cavity type, resonant radiofrequency wave, plasma generating apparatus for producing a beam of ions, free radicals and other excited species from the plasma, which is particularly useful for retrofitting molecular beam epitaxy (MBE) apparatus with small inlet ports. In particular, the present invention relates to an improved plasma generating apparatus, wherein a movable probe and plate are provided in a coaxial cavity to tune the radiofrequency wave to selected modes of resonance and to vary the resonance of the mode in a cavity adjacent to a chamber confining the plasma.

(2) Prior Art

Prior art plasma generating apparatus are described in detail in U.S. Pat. Nos. 4,507,588; 4,585,668; 4,630,566; 4,691,662; 4,727,293; 4,777,336 and 4,792,772 to Asmussen, Reinhard and others. In these apparatus the probe is described to be mounted perpendicular to the longitudinal axis of the chamber for confining the plasma and the coupler for the radiofrequency waves. These apparatus work very well; however, the perpendicular entry of the probe into the cavity of the radiofrequency wave coupler prevents the apparatus from being used in small inlet port apparatus such as MBE apparatus.

Other patents showing narrow beam apparatus are U.S. Pat. Nos. 3,757,518 and 3,866,414 to Bahr; 4,058,748, 4,316,090 and 4,393,333 to Sakudo et al and 4,409,520 to Koike et al. The Bahr patent describes a coaxial cavity while the other patents describe open cavities for the radiofrequency waves.

Other prior art includes the apparatus described by R. M. Fredericks in "An Experimental and Theoretical Study of Resonantly Sustained Plasma in Microwave Cavities", Ph.D. Thesis, Michigan State University (1972), particularly pages 30 to 45; R. E. Fritz, "An Experimental Investigation of the Characteristics of RF Surface Wave Generated Plasmas", M.S. Thesis, Michigan State University, (1979), particularly pages 30 to 38; R. M. Fredericks and J. Asmussen, Proc. IEEE, Vol. 59, No. 2, p. 315, (Feb. 1971); R. M. Fredericks and J. Asmussen, J. Appl. Phys., Vol. 42, No. 9, p. 3647, (Aug. 1971); and J. Rogers and J. Asmussen, IEEE Trans. on Plasma Science, PSIO (1), 11-16, (March 1982). These publications describe apparatus wherein the probe is movable parallel to the longitudinal axis of the cavity and wherein coaxial conductors along the axis are used; however, they do not describe forming a plasma in a chamber adjacent to the cavity confining the microwaves.

OBJECTS

It is therefore an object of the present invention to provide a coaxial cavity, radiofrequency wave plasma generating apparatus, preferably an apparatus which can be inserted into a small diameter (less than about 3.5 inches (8.89 cm)) entry port in a molecular beam epitaxy (MBE) apparatus. In particular, it is an object of the present invention to provide a coaxial radiofrequency wave, plasma generating apparatus for producing beams which is relatively simple and inexpensive to construct. These and other objects will become increasingly apparent by reference to the following description and the drawings.

GENERAL DESCRIPTION

The present invention relates to a plasma generating apparatus including a plasma source employing a radiofrequency, including UHF or microwave, wave coupler means which is metallic and in the shape of a hollow cavity and which is excited in one or more modes of resonance and optionally including a static magnetic field around the plasma which aids in coupling radiofrequency energy at electron cyclotron resonance and aids in confining ions in the plasma in an electrically insulated chamber means in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; movable metal plate means in the cavity mounted in the coupler means perpendicular to the central longitudinal axis and movable along the central longitudinal axis towards and away from the chamber means; and a movable probe means connected to and extending inside the coupler means for coupling the radiofrequency waves to the coupler means, the improvement which comprises: probe means which is elongate mounted in the coupler means in line with the central longitudinal axis of the chamber means and coupler means with an end of the probe in spaced relationship to the chamber means;

and a coaxial conductor means mounted along the longitudinal axis of the cavity such that a distal end of the conductor means is adjacent to a closed end of the chamber means opposite the opening from the chamber means.

The present invention particularly relates to a plasma generating apparatus including a plasma source employing a radiofrequency, including UHF or microwave, wave coupler means which is metallic and in the shape of a hollow cavity and which is excited in one or more modes of resonance and optionally including a static magnetic field around the plasma which aids in coupling radiofrequency energy at electron cyclotron resonance and aids in confining ions in the plasma in an electrically insulated chamber means in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; movable metal plate means in the cavity mounted in the coupler means perpendicular to the central longitudinal axis and movable along the central longitudinal axis towards and away from the chamber means; and a movable probe means connected to and extending inside the coupler means for coupling the radiofrequency waves to the coupler means, the improvement which comprises: probe means which is elongate mounted in the coupler means in line with the central longitudinal axis of the chamber means with an end of the probe in spaced relationship to the chamber means; plate means having an opening in line with the central longitudinal axis of the chamber means which supports the probe means so that the probe means can be moved in the opening in the plate means along the central longitudinal axis; a co-axial conductor means mounted along the longitudinal axis of the cavity such that a distal end of the conductor means is adjacent to a closed end of the chamber means opposite the opening from the chamber means; support means for the probe means mounted on an outside portion of the coupler means including adjustable holding means which allows movement of the probe means in line with the central longitudinal axis of the chamber means so as to vary the spacing means between the chamber means and the end of the probe means; and rod means adjustably mounted on the support means and connected to the plate means so as to allow the plate means to be moved towards and away from the chamber means, wherein movement of the plate means and the probe means in the coupler means achieves a selected mode of resonance and varies the resonance of the mode of the radiofrequency wave in the chamber means.

The coaxial cavity (or as it is usually called coaxial cable can be divided into three groups: (1) transverse magnetic "TM", (2) transverse electric "TE" and (3) transverse electromagnetic "TEM". The coaxial cavity has a center conductor partially filling the cross section. The presence of this conducting center construction allows the TEM mode to exist. Empty cylindrical and rectangular waveguides only allow TE and TM modes to exist.

The TEM mode, which is preferred, has a radial electric field and circumferential magnetic field. Both the electric and the magnetic field entirely lie in a plane transverse (or perpendicular) to the axis of the coaxial cavity. Note that the fields are given by $$E_z = H_z = E_\phi = H_r = 0$$

$$E_r = \sqrt{\frac{\mu_0}{\epsilon_0}} \left(\frac{I}{2\pi r}\right)$$

$$H_\phi = \frac{I}{2\pi r}$$

In contrast the TE and TM modes that have a cutoff frequency and hence will allow propagation for only certain frequencies, the TEM mode has no cutoff frequency. Thus the TEM mode of any frequency will propagate a electromagnetic wave in the coaxial cavity.

The coaxial cavity can support TE, TM or TEM modes. The preferred method of excitation is with only TEM mode with all other TE and TM modes not present (non-propagating).

The coaxial cavity is usually built so that only the TEM mode propagates. Thus, electromagnetic energy cannot radiate out of the open discharge because the TE and TM modes cannot propagate in the quartz tube chamber region. Electromagnetic energy is concentrated at the end of the center conductor adjacent to and within the quartz tube chamber in the form of evanescent TE and TM modes. These strong evanescent fields exist only within a few centimeters from the end of the center conductor.

New process applications in molecular beam epitaxy (MBE) machines require ions and excited species to impinge with low energy onto process substances. The ability of electrodeless, microwave, ECR discharges to operate with little maintenance at low pressures suggests their use as ion and free radical sources in MBE machines.

Existing MBE machines impose very specific design requirements. Sources must operate with little or no maintenance in very low pressure ($<10^{-4}$ Torr) and low flow environments. Operation is often necessary with chemically active gases, such as oxygen, hydrogen, and fluorine containing gases. Vacuum ports on exiting MBE machines limit the outside diameter of a source to less than 5.8 cm. In order to achieve high densities of ions and excited species the source output must be located close to the substrate, i.e. chamber. The preferred apparatus of the present invention is a 2.45 GHz, ECR ion and free radical source that has been specifically designed for the requirements of MBE applications.

There are four independent adjustments of the apparatus of the present invention. They are (1) movement of the inner (center) conductor in and out, (2) adjustment of the plate position, (3) adjustment of the probe coupling loop inside the cavity and (4) the angle $\phi$ of orientation of the coupling loop on its own axis.

SPECIFIC DESCRIPTION

Figure 1:
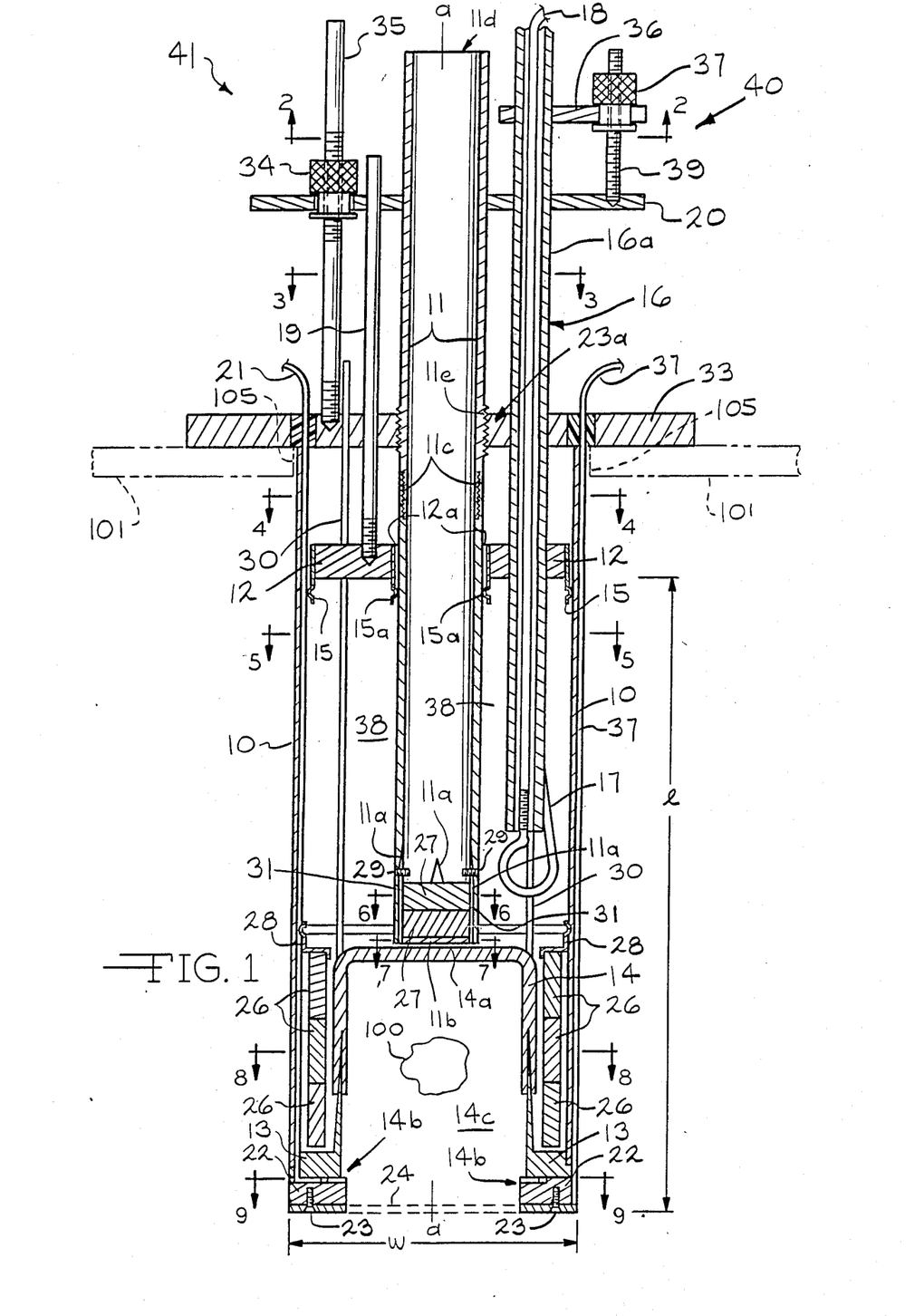
FIG. 1 is a front cross-sectional view of the preferred plasma generating apparatus of the present invention, particularly showing a movable probe 16 mounted parallel to the axis (a—a) of the cylinder 10 and conductor forming the coupler for radiofrequency waves and a conventional movable plate 12 for tuning adjacent a chamber for confining the plasma.
Figures 2, 3:
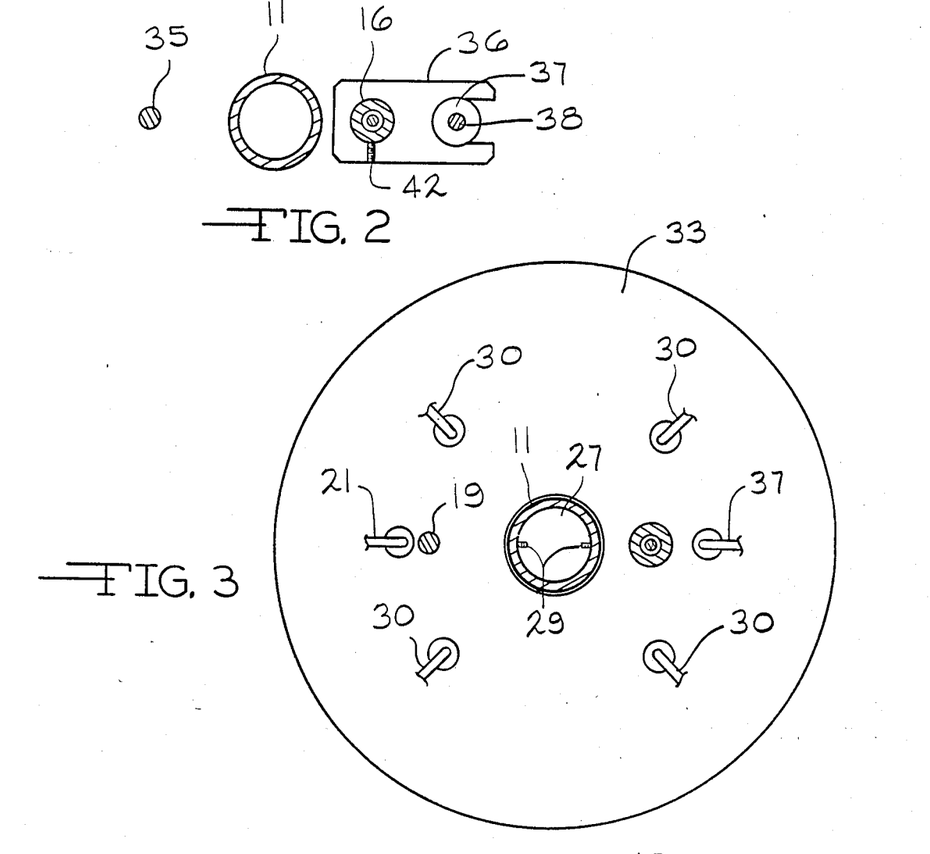
FIG. 2 is a plan cross-sectional view along line 2—2 of FIG. 1.
FIG. 3 is a plan cross-sectional view along line 3—3 of FIG. 1.
Figure 4:
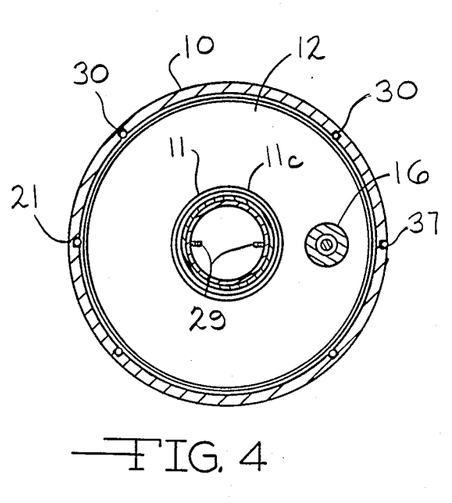
FIG. 4 is a plan cross-sectional view along line 4—4 of FIG. 1.
Figure 5:
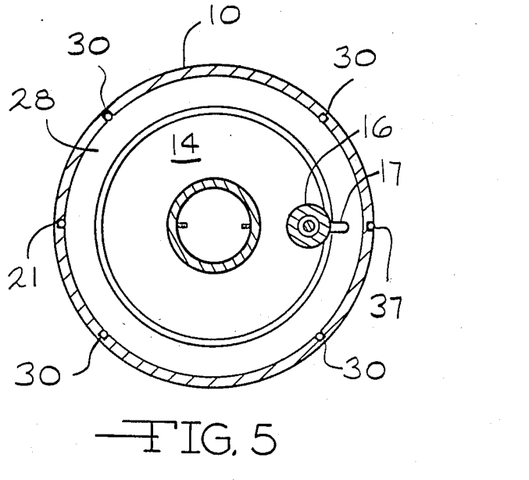
FIG. 5 is a plan cross-sectional view along line 5—5 of FIG. 1.
Figure 6:
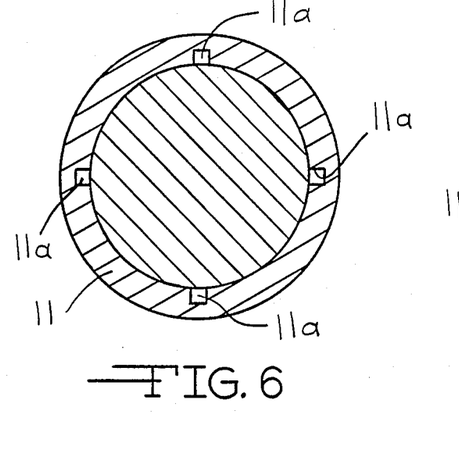
FIG. 6 is a plan cross-sectional view along 6—6 of FIG. 1.
Figure 7:
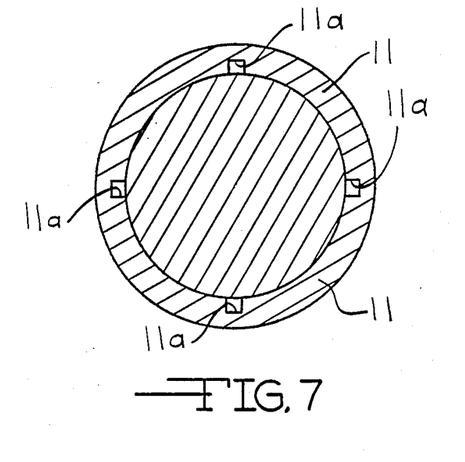
FIG. 7 is a plan cross-sectional view along line 7—7 of FIG. 1.
Figure 8:
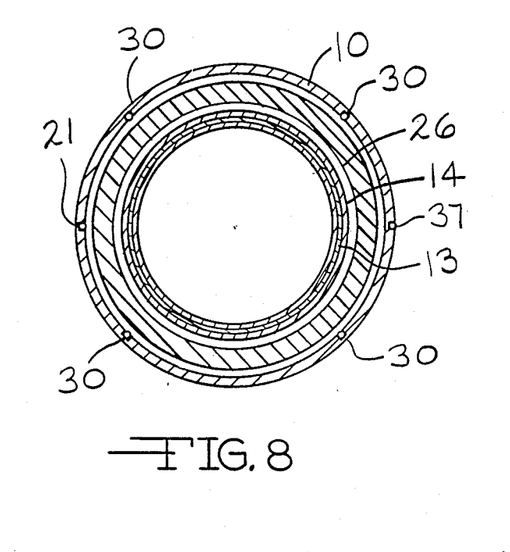
FIG. 8 is a plan cross-sectional view along line 8—8 of FIG. 1.
Figure 9:
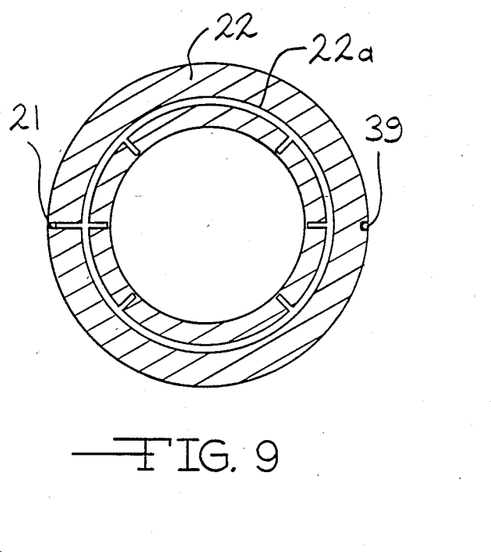
FIG. 9 is a plan cross-sectional view along line 9—9 of FIG. 1.

FIG. 1 shows the ion and free radical source and FIGS. 2 to 9 show various cross-sections. With the exception of the rare-earth magnets described hereinafter, all materials of construction are non-magnetic.

A coaxial radiofrequency wave resonator or coupler is formed by an outer stainless steel cylindrical outer tube 10, a brass conductive inner tube 11 and brass or stainless steel sliding short or plate 12, and a stainless steel flange 13 brazed to a quartz tube-molybdenum cup assembly 14. The quartz tube-cup assembly 14 is closed on the end 14a that is furthest inside the outer tube 10 and open at the opposite end 14b adjacent the flange 13. The sliding short 12 is used to adjust the length (l) of the cavity 38. Preferably the length (l) of the cavity 38 is between about 7 and 15 cm and the width is between about 3.5 and 6 cm, with a ratio of l to w of about 2 to 1 or above.

Silver plated copper brushes 15 (known commercially as "contact fingers" or "finger stock") provide electrical contact between the sliding short or plate 12 and the outer tube 10. The brushes 15a provide electrical contact between the sliding short or plate 12 and the inner tube 11. The brushes 15 and 15a go around the circumferences of the sliding short or plate 12 and around the center hole 12a of the sliding short or plate 12. A movable coaxial cable with outer conduit 16a, inner conductor 18 and loop 17 couples microwave energy into the cylindrical tube 10 and its adjustment provides impedance matching of the microwave energy in the cylindrical cavity 38 to excitation zone defined by sliding short or plate 12, tube 10, ring 28 and assembly 14. The probe has an N type connector (not shown). The probe 16 is drilled and tapped for insertion into the center conductor 18, so that various sized loops 17 may be used. The loop can be soldered to the outer conductor 16. Axial and rotational motion of the probe 16 and loop 17 within the resonator varies the electromagnetic energy coupling to the plasma 100 in the tube-cup assembly 14. Sliding short or plate 12 is moved axially in the resonator by rods 19, to aid in tuning. Rods 19 are attached to drive plate 20.

The quartz-molybdenum cup assembly 14 and stainless steel flange 13 define the chamber 14c for confining the plasma 100. Gas is input to the plasma 100 in chamber 14c through a gas feed tube 21 and gas feed flange 22, with channels 22a, which is mounted on the stainless steel flange 13. A plasma diffusion screen 24 is mounted on the gas feed flange 22. The gas feed flange 22, and plasma diffusion screen 24 are held together with screws 23. The diffusion screen 24 can have an electrical bias to accelerate ions or electrons from the plasma 100. The plasma diffusion screen 24 can be electrically biased by grid wire 37 along the outside of the outer tube cylinder 10.

A series of three (3) ring magnets 26 are provided around the tube-cup assembly 14. In addition disc magnets 27 are provided adjacent to an upper closed end 14a of the tube-cup assembly 14 inside the inner tube 11. The rings 26 are held in place by metallic retainer clips 28. The magnets 27 are held in place by screws 29. Cooling slots 11a are provided around the circumference of the inner tube 11 parallel to the longitudinal axis (a—a) adjacent the magnets 27 and channels 31 are provided in the slots 11a so that air passes out of the inner tube 11 into the space 38 outside of the inner tube 11 and inside the outer tube 10. Cooling of the ring magnets 26, tube-cup assembly 14 and flange 13 is accomplished by four cooling air inlet tubes 30 terminating adjacent to the clips 28 and directed toward the tube-cup assembly 14, by the rare earth disc magnets 27.

The ring magnets 26 are retained and shielded from electromagnetic energy by the clips 28 which is a brass ring and silver plated copper brushes (contact finger stock). The two disc magnets 27 are retained in the inner tube 11 by the set screws 29 above the magnets 27, and a brass plug 11b soldered into the end of the inner conductor 11. The three ring magnets 26 rest on the four cooling tubes 30 (not shown), allowing air to flow around the outside of the tube-cup assembly 14.

The inner conductor tube 11 is made of two sections which are screw threaded together at 11c. Their separation allows easy insertion or removal of the disc magnets 27. In addition, the end 11d of the inner tube 11 is fitted with a conventional adaptor (not shown) for cooling air input. The inner tube 11 has threads 11e in the vicinity of a top plate-vacuum flange 33, which has internal threads 23a. The position of the end of the inner tube 11 and disc magnets 27 is varied by rotation of the inner tube 11 in the flange 33.

Adjustment mechanisms 40 and 41 provide for adjustment of the sliding short 12 and coupling probe assembly 16. In the mechanism 41, the sliding short or plate 12 is moved by the rods 19 attached to drive plate 20. The position of the rods 19 is varied by rotation of adjusting nut 34, through which passes a threaded rod 35, which is secured to flange 33. In the mechanism 40, the coupling probe 16 is moved by two adjustments. The probe 16 passes through and is secured to plate 36. The probe 16 moves through plate 20, flange 33 and sliding short or plate 12. The probe 16 is moved in line with the axis (a—a) by adjusting nut 37, through which passes a threaded rod 38 secured to plate 20. The movement of plate 20 or plate 36 varies the probe 16 position in the space 38. The probe 16 is secured to plate 36 by a set screw 42 (FIG. 2) so that the orientation of the loop 17 relative to axis a—a can be varied.

Figure 10:
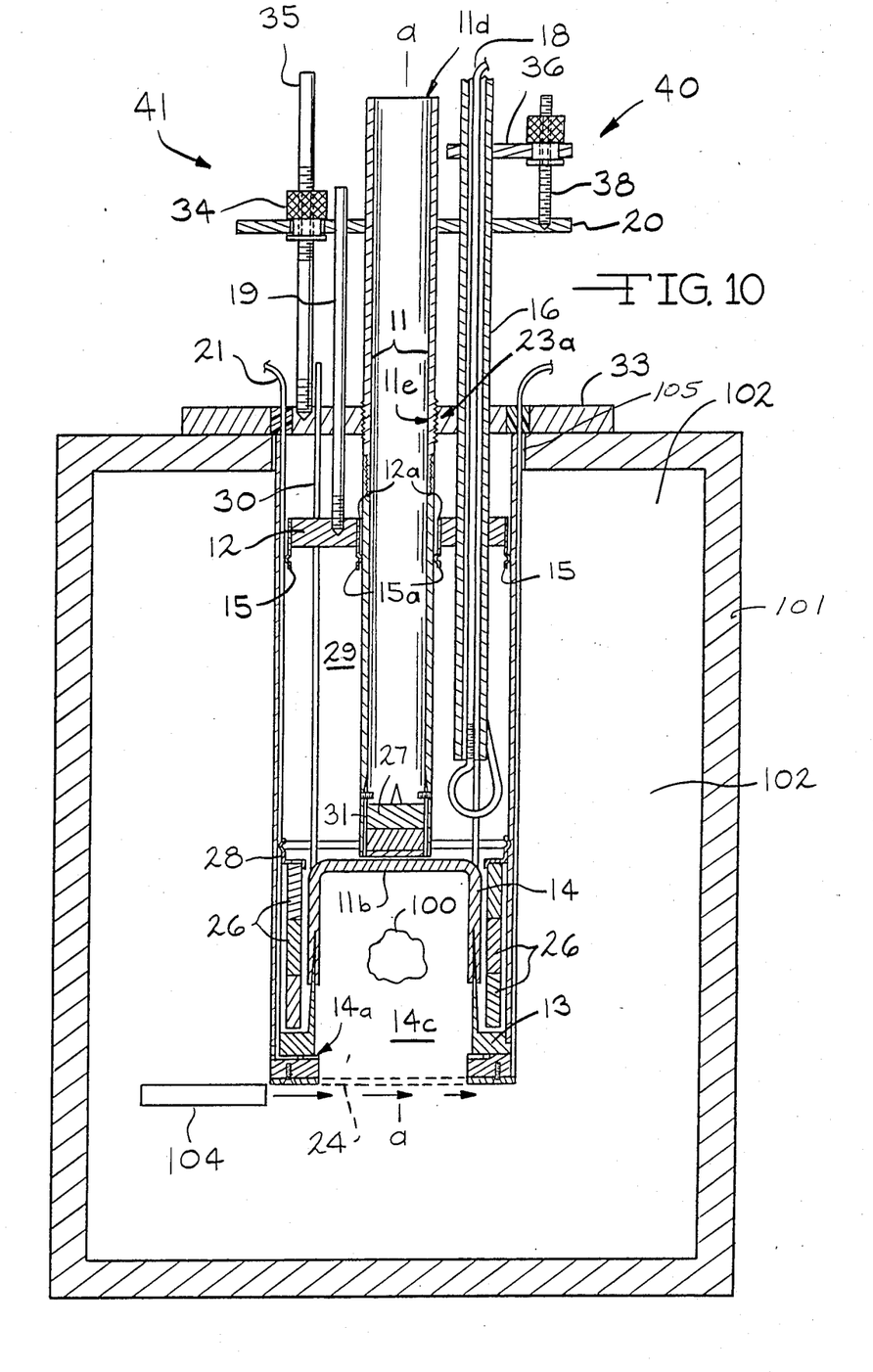
FIG. 10 shows the apparatus of FIG. 1 mounted on a vacuum chamber 102.

As shown in FIG. 10, the apparatus is provided in a vacuum apparatus 101 with a chamber 102, usually a mounting port 105 of an existing Perkin-Elmer or Varian vacuum apparatus or MBE machine with a 2¼ inch (5.72 cm) opening to receive the apparatus.

The components of the preferred apparatus are as follows:

TABLE I

| Coaxial Resonant Assembly: | |
|---|---|
| Inner tube 11 - | 0.625" (1.59 cm) od/ 0.509" (1.29 cm) id cavity length plus 4 to 5" (10.2 cm to 12.7 cm) |
| Outer tube 10 - | stainless steel tube, 2.25" (5.72 cm)/2.084" (5.21 cm) id cavity length non-magnetic |
| Air Inlet Conduits 30 - | stainless steel tube, 0.047" (0.119 cm) od/ 0.031" (0.078 cm) id; outer tube 11 length plus several inches; × 5 tubes |
| Sliding Short - or plate 12 | ¼" (0.635 cm) brass plate, 2.25" (5.72 cm) diameter |
| Magnets 27, SmCo disk- | 0.5" (1.27 cm) diam, 0.25" (0.635 cm) thick; 2 magnets |
| Clips 28 - | 0.020" (0.05 cm) brass plate, 2.25" (5.77 cm) diam. |
| Brushes- | 17" (43.2 cm) |
| Magnets 26, SmCo ring - | 1.94" (4.93 cm) od/ 1.625" (4.13 cm) id, 0.50" (1.27 cm) high; 3 magnet sets |
| Quartz Cup mounted on a Molybdenum cup - | available commercially |
| Flange 13 - | stainless steel 2.25" (5.72 cm) od/ 1.484" (3.77 cm) id, 3/16" (0.48 cm) thick non-magnetic |
| Gas Feed Flange 22 - | thick stainless steel plate, 3/36" (0.48 cm), 2.25" (5.72 cm) diam, non-magnetic |

TABLE I-continued

| | |
|---|---|
| Coaxial Input Probe 16 - | 0.325" (0.83 cm) rigid cable with type N connector |
| Set Screws 23 - | stainless steel, with teflon or ceramic grommets Retaining rings (not shown) for finger stock are made from brass tube |
| Drive Mechanisms: | |
| Plate 20 - | aluminum plate, 2 5/8" (6.67 cm) × 1½" (3.81 cm) × ⅛" (0.32 cm) |
| Plate 36 - | aluminum plate, 1⅛" (2.86 cm) × 1½" (3.81 cm) × ⅛" (0.32 cm) |
| Threaded Rods 35 and 37 - | steel, ⅛" (0.32 cm) diam, approximately 5" (12.7 cm) long |
| Stainless Steel Rods 19- | ⅛" (0.32 cm) diameter, cavity length plus 3" (7.62 cm); 2 pieces |
| Adjustment Screws 34 and 37 - | brass, ½" (1.27 cm) rod, approximately b 1½" (3.81 cm) long |
| Plasma Diffusion Screen 24 - | ⅛" (0.22 cm) to ¼" (0.635 cm) hole diameter, 1/32" (0.079 cm) to 1/16" (0.159 cm) thick, non-magnetic stainless steel |

All 2.25" (5.72 cm) O.D.'s are turned down to approximately 2.245" (5.702 cm) O.D. to fit into a 2.25" (5.72 cm) tube in the vacuum apparatus 101.

The rods 19 can be locked into the short 12 by means of set screws (not shown) or the like. The rings 15 and 15a are held in place on short 12 by rings (not shown) which are soldered in place.

Figure 11:
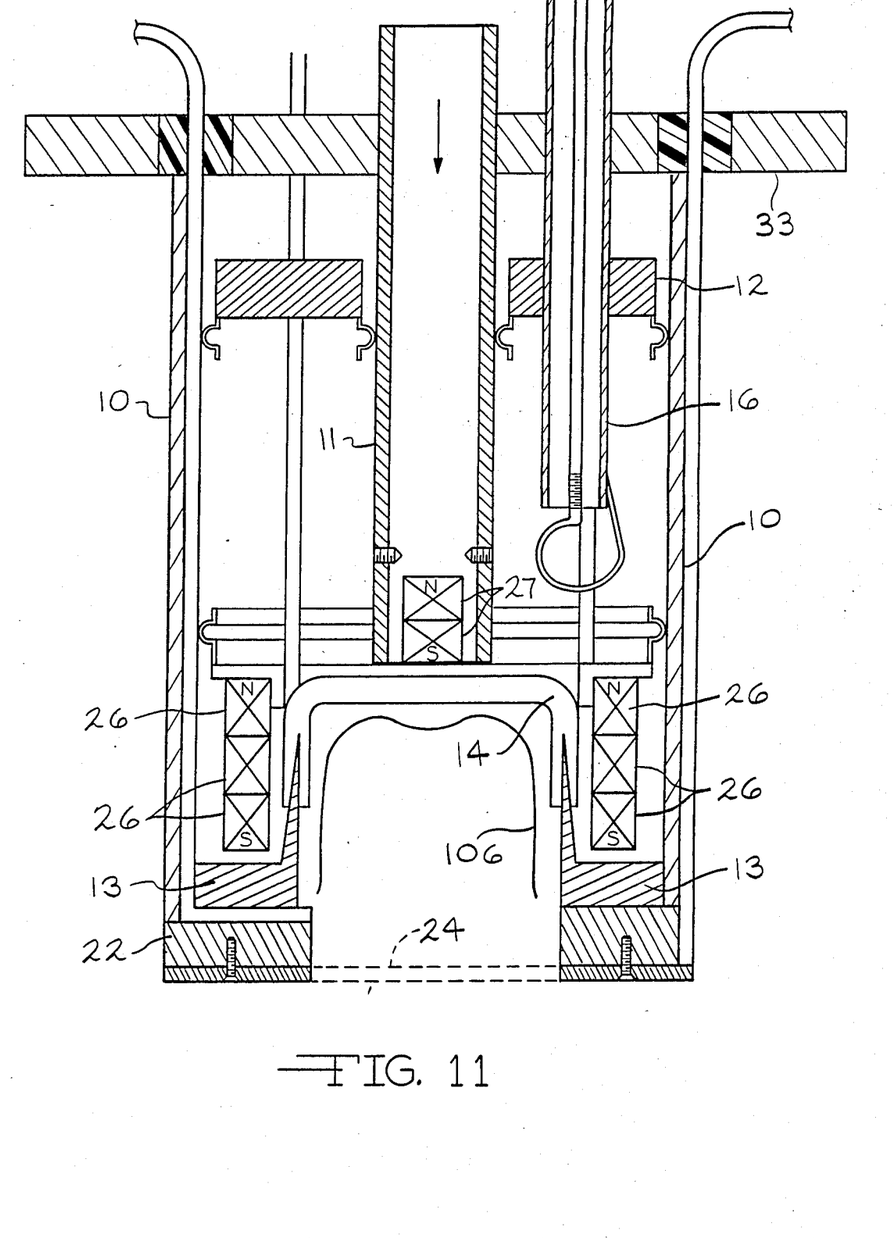
FIGS. 11 and 12 are front cross-sectional views of the apparatus of FIG. 1 showing different field orientations of the magnets 27 which creates different electron cyclotron resonance (ECR) in the chamber 14.
Figure 12:
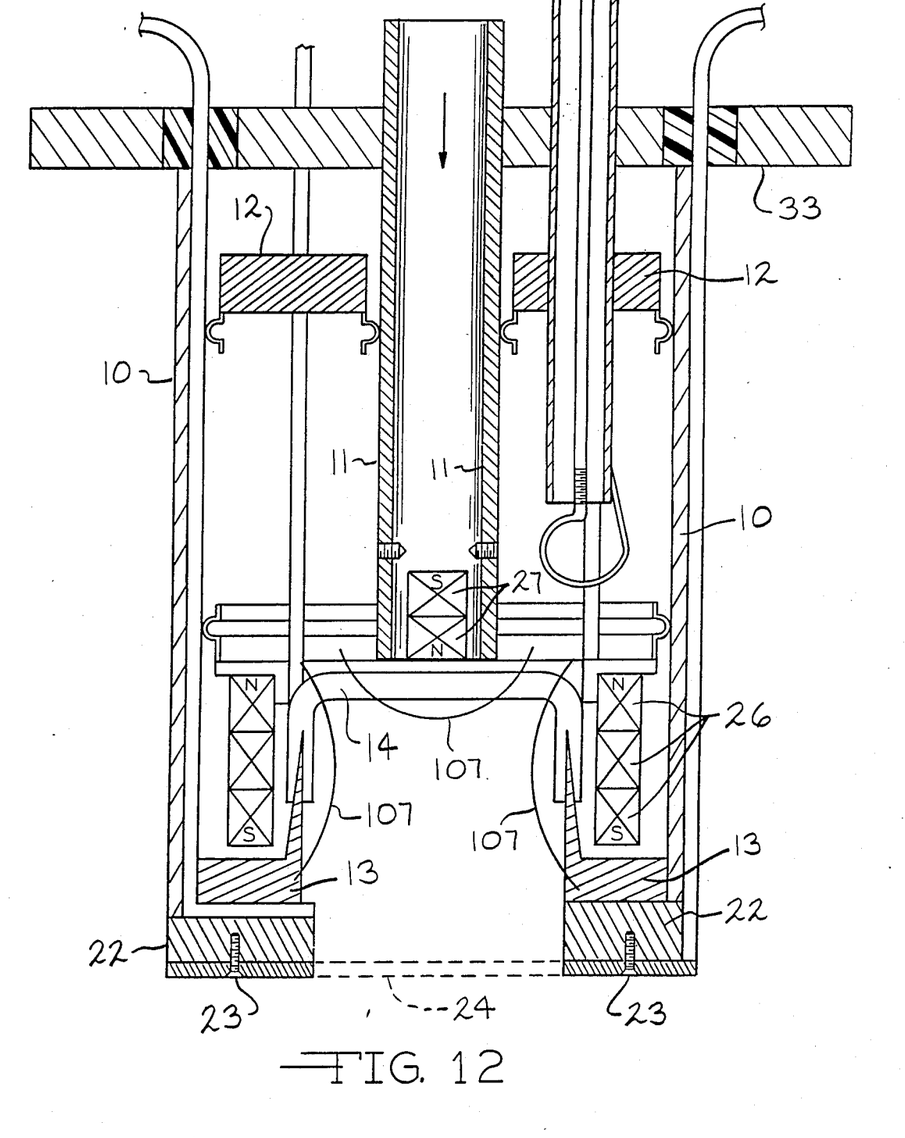

The pole positions of the disc magnets 27 (or magnets 26) can be varied to change the electron cyclotron resonance in the plasma 100 in the tube-cup assembly 14 as shown in FIGS. 11 and 12. This can easily be accomplished by those skilled in the art.

The design of the improved plasma generating apparatus is based on several features. These are briefly summarized as follows:

(1) Excitation of a TEM wave in a coaxial structure (since the inside diameter of cylinder 10 is preferably less than 3½ inches (8.89 cm), all other coaxial waveguide modes can not propagate).

(2) Adjustable sliding short or plate 12 at one end of the cavity 38.

(3) Microwave input coupling through the end of the cylindrical cavity 38 by rotating coupling loop 17 or by axially moving probe 16.

(4) The inner tube 11 is also adjustable allowing the fringing fields at its end to be adjusted for optimal microwave coupling to the plasma 100.

Method of Operation

Impedance matching of the apparatus is accomplished by independently adjusting: (1) the inner tube 11, (2) the input coaxial coupling loop 17 and probe 16 and (3) the sliding short 12 position.

The plasma 100 is formed in a disk shaped (or cylindrically shaped) discharge chamber 14c located in an assembly 14 at one end of the coaxial cavity 38. The plasma 100 is defined by an assembly 14 which is held at a reduced pressure and into which the feed gases (the source of ions and free radicals) flow, via tubes 21.

The rare earth magnets 26 and 27 are used for electron cyclotron resonance (ECR). As shown in FIGS. 11 and 12, rare earth magnets 26 and 27 surround the chamber 14c producing ECR zones 106 and 107 within the chamber 14c and reducing ion and electron diffusion losses to the walls of the quartz tube assembly 14. At 2.45 GHz, ECR zones occur at magnetic field surfaces where the magnetic field strength equals 875 Gauss as illustrated in FIGS. 11 and 12. The magnetic fields from the magnets 26 and 27 are shaped to produce a high field at the excitation end 14a and a low magnetic field in the chamber 14c and at the ion or free radical extraction end 14b of the quartz molybdenum tube.

A particularly unique feature of the present apparatus is the placement of two disk shaped rare earth magnets inside the inner tube 11 and adjacent to the quartz-molybdenum tube assembly 14. These magnets 27 together with magnets 26 surround the sides of the quartz tube assembly 14 and are able to produce the ECR zones 106 or 107 at the excitation end 14a of the quartz molybdenum tube 14. The magnetic field sheath is reduced and diverges like a magnetic mirror at the output of the discharge. This has the benefit of accelerating (pushing) the electrons (and hence the ions) out of the end 14b.

EXAMPLE 1

The following Example shows the specific operation of the plasma generating apparatus.

(1) Evacuate the discharge zone 14c to a low pressure environment (<1 mTorr).

(2) Adjust sliding short 12, inner tube 11, and probe 16 to (breakdown) starting positions-determined by initial resonance frequency calibration test of the apparatus.

(3) Turn on gas in tube 21 to a flow of 5-15 sccm producing a pressure of 1-10 mTorr inside the discharge zone 14c.

(4) Turn on and adjust microwave power supply to 20-50 W CW and measure incident and reflected power. Further "tune" applicator to minimize reflected power until discharge breakdown and plasma formation occurs inside chamber 14.

(5) Once breakdown is achieved adjust the input power and gas flow rate in tube 21 to desired levels and retune the apparatus for zero reflected power.

(6) During operation the gas flow rate in tube 21, input power and coupler tuning are adjusted to desired operating conditions. When operating with a MBE machine, a shutter 104 (FIG. 10) should be used. The shutter 104 blocks all ions, and free radicals from the lower vacuum chamber 102 until their input is desired.

One specific example of the coaxial cavity 38 operation is excite with the TEM mode and then adjust:

(1) the inner conductor 11 is placed within about 3 mm of the quartz chamber 14.

(2) The coaxial loop 17 of the probe 16 in the $\phi = 0$ position (radial to the axis of the cavity as shown in FIG. 1).

(3) The sliding short or plate 12 can be located at Ls, where Ls is the length of the center conductor in the cavity between the sliding short or plate and the chamber in the figure below and n=1, 3, 5 i.e. an odd integer. The electric field pattern for the TEM mode described by $$Ls = \frac{3\lambda}{4} \text{ mode.}$$

If f=2.45 GHz, =12.25 cm and Ls 9 cm.

Once the plasma discharge ignites, the sliding short or plate 12 is readjusted slightly (pulled out further usually several millimeters) for a matched condition (zero reflected power).

A metal screened viewing window (not shown) can be cut in the side of the outer tube 10 adjacent to the quartz molybdenum tube 14 for viewing of the plasma. This screened window, of course, cannot be used if installed inside of vacuum chamber, since it would be inside the vacuum chamber 102.

Ion or free radical extraction takes place with the following grid 24 (or screen) options.

(1) A large circular hole or an array of rather large holes (about 1/16" to ¼" or 0.159 to 0.635 cm) allowing the plasma 100 (ions, electrons and free radicals) to freely diffuse into the vacuum chamber 102. By adjusting input gas flow rates in tube 21 and discharge pressure the various species concentrations can be varied.

(2) With a fine mesh on screen 24 (1 mm to 10 microns) and a low dc voltage (20-300 volts) applied to screen 24, a low energy ion beam can be extracted from the plasma 100.

(3) A double grid set with a neutralizing filament can be used to extract a high energy ion beam (600-2,000 V).

Figure 13:
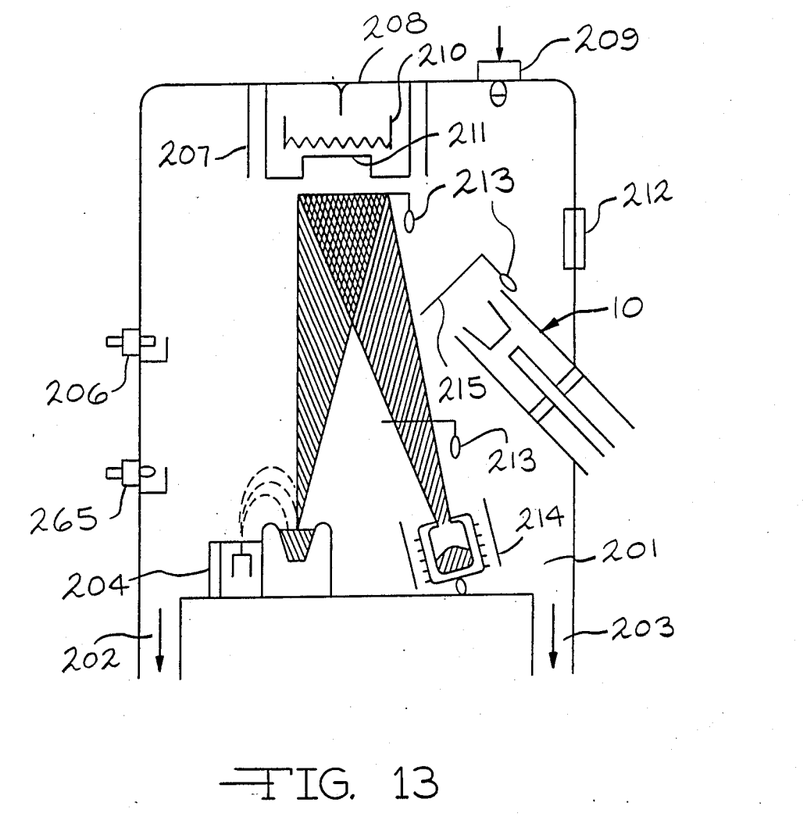
FIG. 13 shows the apparatus 10 of the present invention mounted in a conventional MBE machine.

Conventional ECR ion and plasma sources often require bulky and heavy electromagnets and use waveguide applicators which do not allow wave propagation at 2.45 GHz if the diameters are reduced below 7 cm. Thus, MBE applications required a new approach to ECR design. Several novel design features are combined in the present invention. A tunable, coaxial applicator apparatus 10 which is excited in the TEM mode, is employed to match microwave energy into a cylindrical quartz discharge zone of the chamber 14 for confining the plasma. Rare earth magnets 26 surround the discharge to produce an ECR surface within the discharge volume and also produce a diverging mirror-like magnetic field at the source output. This apparatus 10, which operates with 80 W to 150 W of microwave power, forms a 3.75 cm diameter discharge and can be operated with either single or double extraction grids 22 or with a completely open output allowing the electrons, ions, and excited species to diffuse into the processing environment. The compact nature of this ion-free radical apparatus 10 permits its location well within the MBE machine as shown in FIG. 13. Thus, it provides a high density source of ions and free radicals in the MBE environment. This allows new low temperature chemical processes to take place within the MBE machine. This apparatus 10 can be operated as (1) a broad beam source of high energy ions (using double grids 22 at the opening from the chamber, using a frequency of 600-1,500 MHz, (2) a source of low energy ions and free radicals (using a single grid 22 at the opening from the chamber with acceleration voltages of 50 to 150 volts), (3) Just a source of low energy plasma (with an open end or a screen 22 with large holes at the open end of the chamber)

The system 200 can be used for:
(1) ion beam milling and etching;
(2) sputter disposition; and
(3) low energy ion/free radical source for thin film disposition - diamond and superconductor films.

The apparatus can also be used with chemically active gases like $O_2$, $SF_6$, $CF_4$, $H_2$, and the like. The apparatus provides low maintenance since it is electrodeless.

FIG. 13 shows a conventional MBE system 200 wherein the apparatus 10 is mounted in a vacuum chamber 201 for deposition of silicon (Si) and antimony (Sb) in a film. Various conventional parts of the system are: titanium-sublimation pump 202, turbomolecular pump 203, e gun, Si source 204, ionization gauge 205, mass spectrometer 206, heat shielding 207, thermocouple 208, quartz-crystal thickness monitor 209, optional hot plate 210, substrate holder 211, view point or port 212, mechanical shutters 213, Sb effusion cell 214, ions and radical excited species 215.

It is intended that the foregoing description be only illustrative of the present invention and that the present invention be limited only by the hereinafter appended claims.

I claim:

1. In a plasma generating apparatus including a plasma source employing a radiofrequency, including UHF or microwave, wave coupler means which is metallic and in the shape of a hollow cavity and which is excited in one or more modes of resonance and optionally including a static magnetic field around the plasma which aids in coupling radiofrequency energy at electron cyclotron resonance and aids in confining ions in the plasma in an electrically insulated chamber means in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; movable metal plate means in the cavity mounted in the coupler means perpendicular to the central longitudinal axis and movable along the central longitudinal axis towards and away from the chamber means; and a movable probe means connected to and extending inside the coupler means for coupling the radiofrequency waves to the coupler means, the improvement which comprises:
  (a) probe means which is elongate mounted in the coupler means in line with the central longitudinal axis of the chamber means and coupler means with an end of the probe in spaced relationship to the chamber means; and
  (b) a coaxial conductor means along the longitudinal axis of the cavity such that a distal end of the conductor means is adjacent to a closed end of the chamber means opposite the opening from the chamber means.

2. The apparatus of claim 1 wherein magnets are provided around and outside of the chamber means.

3. The apparatus of claim 1 wherein magnets are provided at the distal end of the conductor means.

4. In a plasma generating apparatus including a plasma source employing a radio frequency, including UHF or microwave, wave coupler means which is metallic and in the shape of a hollow cavity and which is excited in one or more modes of resonance and optionally including a static magnetic field around the plasma which aids in coupling radiofrequency energy at electron cyclotron resonance and aids in confining ions in the plasma in an electrically insulated chamber means in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radio frequency wave applied to the coupler means creates and maintains the plasma around the central longitudinal axis in the chamber means; movable metal plate means in the cavity mounted in the coupler means perpendicular to the central longitudinal axis and movable along the central longitudinal axis towards and away from the chamber means; and a movable probe means connected to and extending inside the coupler means for coupling the radio frequency waves to the coupler means, the improvement which comprises:

(a) probe means which is elongate mounted in the coupler means in line with the central longitudinal axis of the chamber means and coupler means with an end of the probe in spaced relationship to the chamber means;

(b) plate means having an opening in line with the central longitudinal axis of the chamber means which supports the probe means so that the probe means can be moved in the opening in the plate means along the central longitudinal axis;

(c) a co-axial conductor means mounted along the longitudinal axis of the cavity such that a distal end of the conductor means is adjacent to a closed end of the chamber means opposite the opening from the chamber means;

(d) support means for the probe means mounted on an outside portion of the coupler means including adjustable holding means which allows movement of the probe means in line with the central longitudinal axis of the chamber means so as to vary the spacing means between the chamber means and the end of the probe means; and (e) rod means adjustably mounted on the support means and connected to the plate means so as to allow the plate means to be moved towards and away from the chamber means, wherein movement of the plate means and the probe means in the coupler mean achieves a selected mode of resonance and varies the resonance of the mode of the radio-frequency wave in the chamber means.

5. The apparatus of claim 4 wherein magnets are provided around and outside of the chamber means.

6. The apparatus of claim 5 wherein the chamber means and conductor means are is shaped as a cylinder around the central longitudinal axis and have cylindrical sides.

7. The apparatus of claim 6 wherein in addition a second set of magnets are provided outside of and adjacent to the closed end of the chamber means on the conductor means.

8. The apparatus of claim 6 wherein the second set of magnets are mounted inside a conductive tube as the conductor means adjacent to the closed end of the chamber means and wherein the tube is perforated adjacent the second set of magnets so that a cooling gas can be provided through the tube into the cavity to particularly cool the second set of magnets and the chamber means.

9. The apparatus of claim 6 wherein a cooling conduit means is provided parallel to and adjacent to the central longitudinal axis with an opening beside the set of magnets adjacent to the cylindrical sides of the chamber means for providing a cooling gas to the set of magnets.

10. The apparatus of claim 6 wherein the coupler means is in spaced relationship to the chamber means around the central longitudinal axis and the set of magnets is positioned between the coupler means and the outside wall of the chamber means and wherein a metallic holding means mounted in the coupler means secures the magnets in position between the outside wall of the chamber means and the coupler means.

11. The apparatus of claim 4 wherein the probe means can be moved around a second longitudinal axis of the probe means which is parallel to the central longitudinal axis, wherein a release means is provided on the support means for releasing the probe means for such movement around the second longitudinal axis of the probe means and then securing of the probe means in position and wherein the probe means is provided with a coupling loop at the end adjacent to the chamber means, whereby the position of the coupling loop in the cavity can be changed upon movement of the probe means around the second longitudinal axis of the probe means.

12. The apparatus of claim 4 wherein at least one grid or screen means is provided at the opening at the one end of the chamber means to confine the plasma to the chamber means and to allow removal of ions and excited species generated in the plasma from the chamber means.

13. The apparatus of claim 4 wherein the chamber means, probe means, plate means, coupler means and conductor means are circular in cross-section perpendicular to the central longitudinal axis of the coupler means and chamber means.

14. The apparatus of claim 4 wherein the gas supply means is provided on an inside wall of the coupler means so as to supply gas to the chamber means.

15. The apparatus of claim 4 wherein the chamber means is shaped as a cylindrical wall around the central longitudinal axis with a cylindrical inside surface and a cylindrical outside surface of the wall, wherein a set of magnets in a ring are provided around the central longitudinal axis adjacent the outside surface of the wall of the chamber means, wherein a second set of magnets is provided adjacent to the closed end of the chamber means, wherein the second set of magnets are mounted inside a conductive tube as the conductor means adjacent to the closed end of the chamber means, wherein the tube is perforated adjacent to the second set of magnets so that a cooling gas can be provided through the tube into the cavity to cool the second set of magnets, the cavity and the chamber means; and wherein a cooling gas conduit is provided on an inside surface of a wall of the coupler means parallel to and adjacent to the central longitudinal axis with an opening beside the set of magnets for providing a cooling gas to the set of magnets.

16. The apparatus of claim 15 wherein the cooling conduit is provided in a recess in the inside surface of the wall of the coupler means parallel to the central longitudinal axis.

17. The apparatus of claim 16 wherein the gas supply means for forming the plasma is a second conduit provided in a second recess in the inside surface of the wall of the coupler means parallel to the central longitudinal axis.

18. The apparatus of claim 17 wherein the wall of the coupler means is in spaced relationship to the wall of the chamber means around and perpendicular to the central longitudinal axis so as to position the set of magnets between an inside surface of a wall of the coupler means and the outside surface of the wall of the chamber means and wherein a conductive holding means mounted on the coupler means secures the set of magnets in position between the wall of the chamber means and the wall of the coupler means.

19. The apparatus of claim 18 wherein the probe means is provided with a coupling loop at the end adjacent to the chamber means.

20. The apparatus of claim 19 wherein at least one grid or screen means is provided at the opening from the chamber means to confine the plasma to the chamber means and to allow controlled removal of ions and excited species generated from the plasma.

21. The apparatus of claim 20 wherein the chamber means, probe means, plate means, conductor means and coupler means are circular in cross-section perpendicular to the central longitudinal axis of the chamber means.

22. The apparatus of claim 21 wherein the chamber means is composed of quartz.

23. The apparatus of claim 22 wherein the chamber means is composed of quartz and molybdenum.

24. The apparatus of claim 15 wherein the probe means can be moved around a second longitudinal axis of the probe means which is parallel to the central longitudinal axis, wherein a release means is provided on the support means for releasing the probe means for such movement around the longitudinal axis of the probe means and then for securing the probe means in position and wherein the probe means is provided with a coupling loop at the end adjacent to the chamber means, whereby the position of the coupling loop in the cavity can be changed upon movement of the probe means around the second longitudinal axis of the probe means.

25. The apparatus of claim 1 wherein the coupler means has a length which is significantly greater than a cross-sectional width perpendicular to the longitudinal axis.

26. The apparatus of claim 25 wherein the length of the cavity confining the radiofrequency waves is between about 7 cm to 15 cm and the width is about 3.5 cm to 6 cm.

27. The apparatus of claim 1 mounted on a vacuum system.

* * * * *